(12) United States Patent
Colclaser et al.

(10) Patent No.: US 6,507,471 B2
(45) Date of Patent: Jan. 14, 2003

(54) ESD PROTECTION DEVICES

(75) Inventors: Roy A. Colclaser, Albuquerque, NM (US); James R. Spehar, Albuquerque, NM (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 202 days.

(21) Appl. No.: 09/733,518

(22) Filed: Dec. 7, 2000

(65) Prior Publication Data

US 2002/0071230 A1 Jun. 13, 2002

(51) Int. Cl.[7] .............................. H02H 3/22; H03F 3/45
(52) U.S. Cl. .................. 361/111; 361/56; 327/309; 330/253
(58) Field of Search ................. 361/56, 111; 257/355, 257/3, 360, 362; 327/309, 327; 330/253, 354

(56) References Cited

U.S. PATENT DOCUMENTS

| | | | | |
|---|---|---|---|---|
| 3,879,640 A | * | 4/1975 | Schade, Jr. .................. 257/355 |
| 4,044,313 A | * | 8/1977 | Wittlinger et al. ........ 330/207 P |
| 4,206,418 A | * | 6/1980 | Dingwall .................... 330/253 |
| 4,940,907 A | * | 7/1990 | Laude ......................... 327/73 |
| 5,311,083 A | | 5/1994 | Wanlass | |
| 5,862,031 A | * | 1/1999 | Wicker et al. .............. 361/111 |

* cited by examiner

*Primary Examiner*—Kim Huynh
(74) *Attorney, Agent, or Firm*—Harold Tsiang

(57) ABSTRACT

A circuit arrangement provides a way of protecting a differential pair of bipolar transistors by diverting the current into an n-channel MOSFET which is driven into conduction during an ESD event and allows a larger swing of input voltage than the anti-parallel diode pair. No extra processing steps are required and the MOSFET is driven on, rather than relying on parasitic bipolar npn transistor triggering into snap-back as in the grounded gate NMOS transistor that is commonly used for ESD protection in CMOS integrated circuits. An ESD protection circuit is provided for protecting a differential pair of transistors having two input terminals. The circuit comprises a switching element (such as an NMOS transistor) having first and second terminals and a control terminal; a first resistive element, coupled between the first and control terminals of the switching element; and a second resistive element, coupled between the second and control terminals of the switching element; wherein the first and second terminals of the switching element are for connecting, respectively, to input terminals of the different pair.

16 Claims, 3 Drawing Sheets

ESD PROTECTION DEVICES

BACKGROUND OF THE INVENTION

The invention generally relates to electronic protection devices, and more particularly to electrostatic discharge (ESD) protection devices.

Integrated circuits are susceptible to a variety of reliability problems. One of these issues is the possible vulnerability to ESD events. ESD occurs when a charged object, e.g., a piece of equipment used to install integrated circuits into a printed circuit board, is brought into close proximity to a pin of an integrated circuit that is at a different potential compared to the charged object. The discharge consists, typically, of current levels exceeding an ampere during a time period less than 200 nanoseconds. The magnitude of the peak current and the waveshape of the discharge depend on the effective resistance, capacitance and inductance of the system and the amount of charge present before the discharge. The result of ESD on unprotected integrated circuits is often destruction characterized by melting and/or explosion of part of the circuit. It is common practice for the designer to include extra components in an integrated circuit that are intended to provide protection against ESD damage by providing paths for the ESD events that bypass the components used for the normal circuit functions and are not destroyed by the ESD events.

In BiCMOS integrated circuits, a frequently used circuit configuration is a differential pair 10 of bipolar transistors, as shown in FIG. 1. When this configuration is used as an input with the bases of the transistors connected to external bonding pads, it is very difficult to protect these transistors from ESD events.

A typical ESD protection scheme is shown in FIG. 2. If pad A is stressed positive with respect to pad B, one of the likely paths for the ESD current is through a resistor R1, the forward biased base-emitter junction BE-1, the reverse biased base-emitter junction BE-2, and a resistor R2. In high frequency integrated circuits, transistors Q1 and Q2 are small in area, significantly limiting the ability of the base-emitter junction to carry current in the forward direction before the internal power dissipation is sufficient to cause damage. The base-emitter junction is very weak in the reverse direction, with a typical breakdown voltage of 4 V or less. Resistors R1 and R2 are often low-valued resistors to improve performance. The result of this configuration is that it is very difficult to protect the differential pair against the effects of ESD events.

The ESD protection scheme shown in FIG. 2 is required to limit the voltage between points C and D to a safe value during a typical ESD event, where the discharge current may exceed 2 A. For high forward currents, the internal series resistance of the diode results in a larger forward drop (typically 2 to 3 V) than the typical low current diode drop (0.7 V). The preferred current path would be through diode D1, a power supply clamp 12, and diode D2. If it is assumed that the voltage drop across power supply clamp 12 is 5 V, and the voltage across each of the two diodes in forward bias under the ESD event is 3 V, then 11 V appears from pad A to pad B. Also, if it is assumed that the current through the reverse biased BE-2 is limited to 10 mA with a voltage drop of 4 V and that the voltage drop across the forward biased BE-1 is 0.6 V at 10 mA, then the voltage drop across resistor R1 plus resistor R2 must be 6.4 V at 10 mA. The result is that R1 and R2, which are equal, must be at least 320 k$\Omega$ to protect the device. For high performance, it may be necessary to limit R1 and R2 to less than 100$\Omega$ each. Note that it may be necessary to limit the current through the reverse biased base-emitter junctions to 1 mA or less for very small devices. An alternative is to increase the physical size of the transistors, which degrades the performance, to improve ESD protection.

An alternative approach is to divert the current from the input pads A and B directly. One such approach is shown in FIG. 3, where anti-parallel diodes, D5 and D6, are connected between pads A and B. This approach limits the voltage across the differential pair to one high current diode drop (approximately 3 V), if the same assumptions as in the above for FIG. 2 are used. Note that the other diodes are also necessary to provide protection for ESD stresses from the pads to the power supply and ground. The major difficulty with this approach is that the input signal is also diverted by the diode pair D5 and D6, limiting the input swing to approximately 0.6 V in either polarity. If the input swing is larger than this voltage, the anti-parallel diodes D5 and D6 are no longer a valid solution for ESD protection.

Therefore, there is a need for an effective ESD protection scheme that allows a larger swing of an input voltage.

SUMMARY OF THE INVENTION

The invention provides a way of protecting a differential pair of bipolar transistors by diverting the current into an n-channel MOSFET which is driven into conduction during an ESD event and allows a larger swing of input voltage than the anti-parallel diode pair. No extra processing steps are required and the MOSFET is driven on, rather than relying on the parasitic bipolar npn transistor triggering into snap-back as in the grounded gate n-MOS transistor that is commonly used for ESD protection in CMOS integrated circuits.

According to the present invention, an ESD protection circuit is provided for protecting a differential pair of transistors having two input terminals. The circuit comprises a switching element (such as an NMOS transistor) having first and second terminals and a control terminal; a first resistive element, coupled between the first and control terminals of the switching element; and a second resistive element, coupled between the second and control terminals of the switching element; wherein the first and second terminals of the switching element are for connecting, respectively, to input terminals of the different pair.

According to one embodiment of the invention, the first and second resistive elements in the protection circuit are two resistors. The resistance values of the two resistors are preferably equal.

According to another embodiment of the invention, each of the first and second resistive elements in the protection circuit includes a parallel circuit. Each parallel circuit includes a pair of anti-parallel diodes.

According to a further embodiment of the invention, each parallel circuit in the protection circuit further includes two resistors each connected in series with one of the diodes of the parallel circuit. The resistance values of the two resistors in each parallel circuit are preferably equal.

Other objects and attainments together with a fuller understanding of the invention will become apparent and appreciated by referring to the following description and claims taken in conjunction with the accompanying drawings.

BRIEF DESCRIPTION OF THE DRAWINGS

The invention is explained in further detail, and by way of example, with reference to the accompanying drawings wherein.

Throughout the drawings, the same reference numerals indicate similar or corresponding features or functions.

DETAILED DESCRIPTION OF THE PREFERRED EMBODIMENTS

Figure 1:
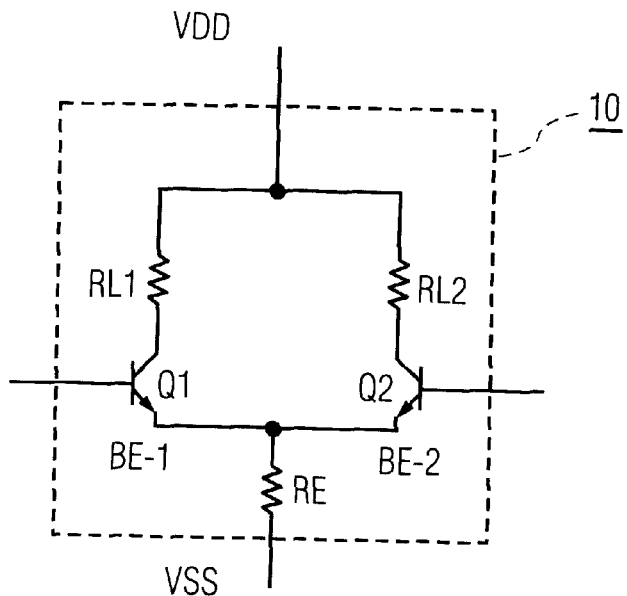
FIG. 1 shows a conventional differential pair of bipolar transistors.
Figure 2:
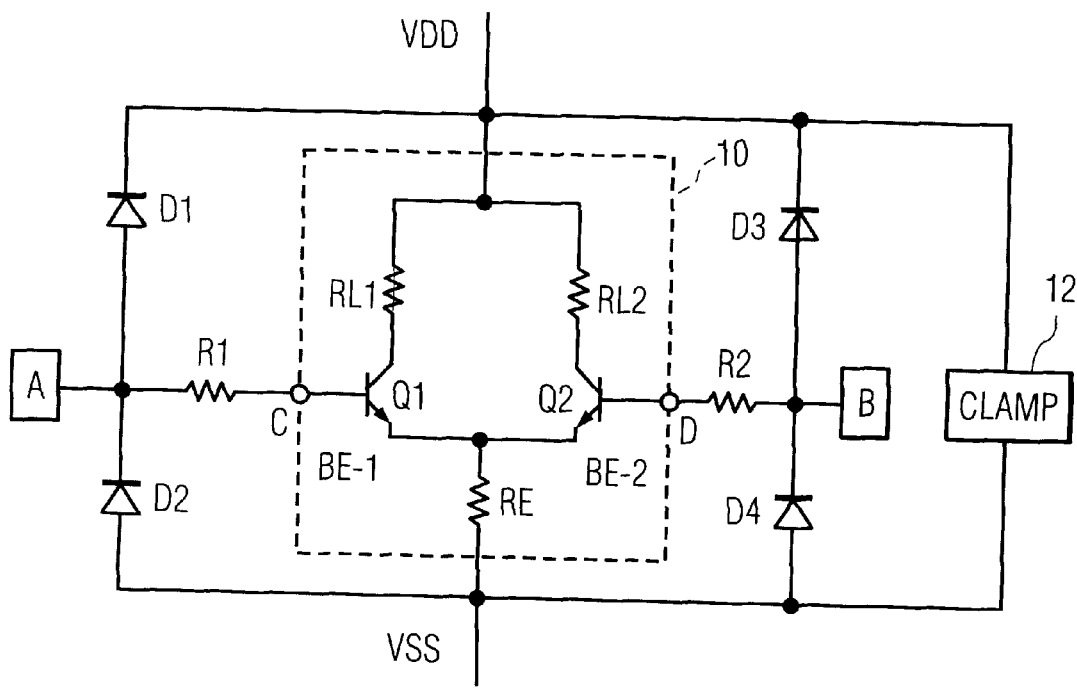
FIG. 2 shows a typical conventional ESD protection scheme.
Figure 3:
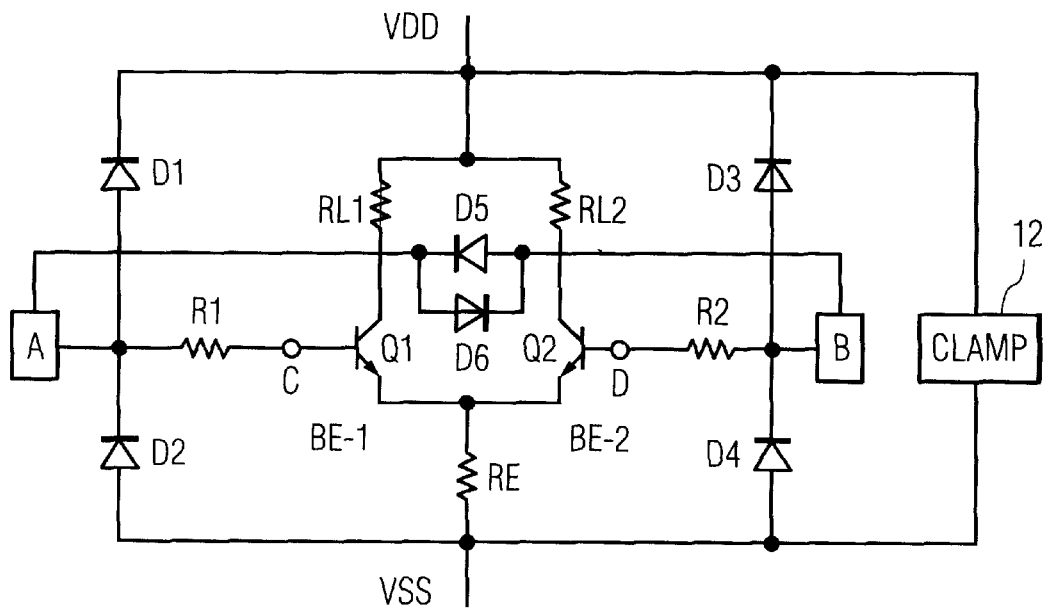
FIG. 3 shows an alternative conventional ESD protection scheme.
Figure 4:
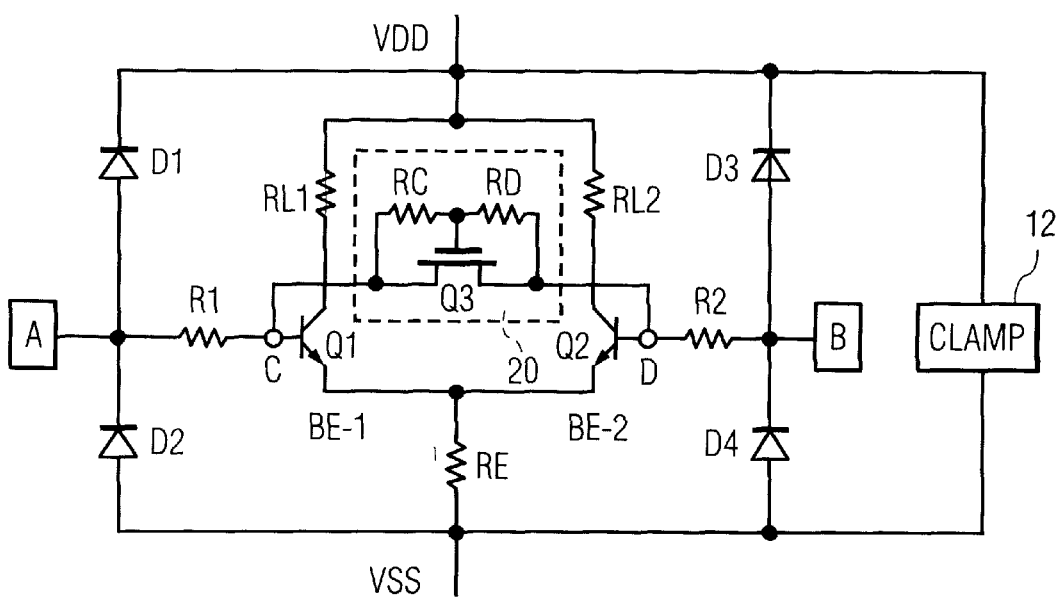
FIG. 4 shows an ESD protection circuit according to one embodiment of the invention.

FIG. 4 shows an ESD protection circuit 20 having a MOS transistor Q3 and resistors RC and RD. Transistor Q3 is placed with its source and drain directly in parallel with differential pair Q1 and Q2, between points C and D. In a preferred embodiment of the invention, transistor Q3 is a symmetrical NMOSFET designed using ESD rules (e.g., silicide is blocked on both sides of the gate to improve the reliability of the transistor under ESD stress). For a symmetrical protection, resistors RC and RD are equal in magnitude and large in value (typically 50 k$\Omega$ to 100 k$\Omega$) to limit the current through these resistors during normal operation. The time constant of the parallel combination of RC and RD and the gate to source capacitance of Q3 should typically be less than 1 nanosecond to assure that Q3 turns on fast enough to protect the bipolar transistors. The width of Q3 is determined by how much of the ESD event is to be absorbed in the structure, as discussed below. The length of Q3 may be the minimum value allowed in the process. The triggering voltage of the protection scheme using Q3 is determined by the threshold voltage, VT, of Q3 (typically 0.6 V). When the voltage from C to D reaches approximately twice the magnitude of VT in either polarity, Q3 will turn on to draw current. A voltage drop across resistors R1 and R2 will occur due to the current. The result will be that the pad voltage from A to B will continue to rise until the diode-clamp combination (D1, Clamp 12 and D4) becomes the primary current path, and the voltage across C to D remains clamped to approximately twice VT. The size of resistors R1 and R2 determines the current level that Q3 must be able to absorb during an ESD event. In general, the larger R1 and R2, the smaller the width required for Q3, and vice versa. For example, if R1 and R2 are 1$\Omega$, and clamp 12 requires 5 V to trigger, then the current through R1 and R2 (and Q3) must be approximately 3 A before some of the current will be diverted from Q3. If R1 and R2 are 10$\Omega$, current in excess of 300 mA will be diverted from Q3. If R1 and R2 are 100$\Omega$, current in excess of 30 mA will be diverted from Q3. The width of Q3 can be adjusted accordingly. Note that if R1 and R2 are zero, the entire ESD event will go through Q3. The input voltage swing during normal operation will have to be larger to accommodate larger values of R1 and R2, but the voltage swing between points C and D will remain the same (less than 1.2 V for the situation described above).

Figure 5:
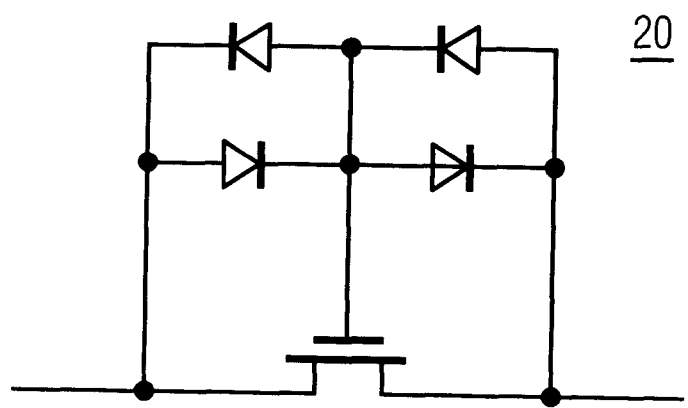
FIG. 5 shows a variation of the ESD protection circuit in FIG. 4.

FIG. 5 illustrates an ESD protection circuit 20, in which resistors RC and RD are replaced with two pairs of anti-parallel diodes. This will provide a similar performance as that in FIG. 4, with a voltage swing limit of approximately 1.4 V.

Figure 6:
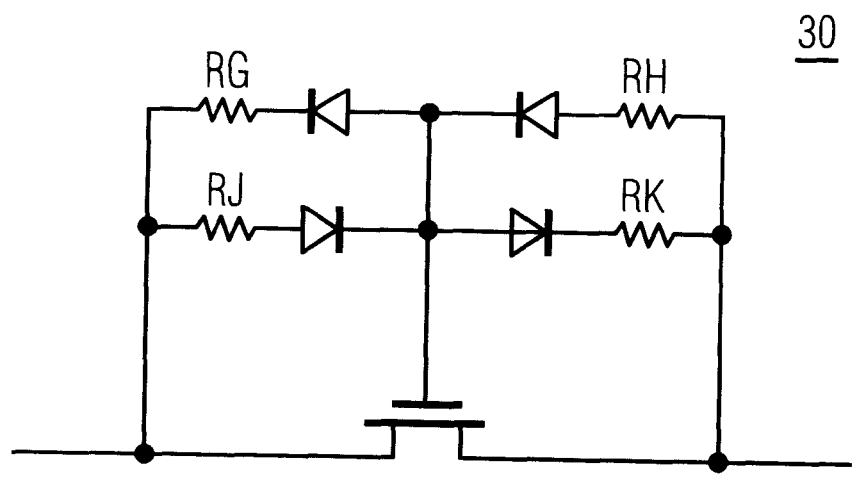
FIG. 6 shows a variation of the ESD protection circuit in FIG. 5.

If the input voltage swing must exceed twice VT, it is possible to skew the triggering voltage by adding extra resistors in series with the diodes as shown in another alternative ESD protection circuit 30 in FIG. 6. In this case RG/RH=RJ/RK, but RG is not equal to RH. For symmetry, RG=RJ and RH=RK, but it is only necessary that the ratio be set properly.

The present invention may also be used in place of the diode D1 between pad A and power supply and the diode D2 between pad A and ground, and in a similar manner, in place of diodes D3 and D4 connected to pad B. In that case, the entire ESD event must go through the MOSFET, so the width of the device would be similar to that of the grounded gate MOSFET currently used as the primary protection in many CMOS integrated circuits.

While the invention has been described in conjunction with specific embodiments, it is evident that many alternatives, modifications and variations will be apparent to those skilled in the art in light of the foregoing description. Accordingly, it is intended to embrace all such alternatives, modifications and variations as fall within the spirit and scope of the appended claims.

What is claimed is:

1. An ESD protection circuit for protecting a differential pair of transistors having two input terminals, comprising:
   a switching element having first and second terminals and a control terminal;
   a first resistive element, coupled between the first and control terminals of the switching element; and
   a second resistive element, coupled between the second and control terminals of the switching element;
   wherein the first and second terminals of the switching element are connecting, respectively, to input terminals of the different pair.

2. The circuit of claim 1, wherein the switching element is an NMOS transistor and the control terminal is its gate terminal.

3. The circuit of claim 1, wherein the first and second resistive elements are two resistors.

4. The circuit of claim 3, wherein the resistance values of the two resistors are equal.

5. The circuit of claim 1, wherein each of the first and second resistive elements includes a parallel circuit.

6. The circuit of claim 5, wherein each parallel circuit includes a pair of anti-parallel diodes.

7. The circuit of claim 6, wherein each parallel circuit further includes two resistors each connected in series with one of the diodes of the parallel circuit.

8. The circuit of claim 7, wherein the resistance values of the two resistors in each parallel circuit are equal.

9. A circuit, comprising:
   a differential pair of transistors having two input terminals; and
   an EDS protection circuit coupled between the two input terminals of the differential pair, the EDS protection circuit including:
      a switching element, having first and second terminals and a control terminal,
      a first resistive element, coupled between the first and control terminals of the switching element, and
      a second resistive element, coupled between the second and control terminals of the switching element.

10. The circuit of claim 9, wherein the switching element is an NMOS transistor and the control terminal is its gate terminal.

11. The circuit of claim 9, wherein the first and second resistive elements are two resistors.

12. The circuit of claim 11, wherein the resistance values of the two resistors are equal.

13. The circuit of claim 9, wherein each of the first and second resistive elements includes a parallel circuit.

14. The circuit of claim 13, wherein each parallel circuit includes a pair of anti-parallel diodes.

15. The circuit of claim 14, wherein each parallel circuit further includes two resistors each connected in series with one of the diodes of the parallel circuit.

16. The circuit of claim 15, wherein the resistance value of the two resistors in each parallel circuit are equal.

\* \* \* \* \*